(12) United States Patent
Pekarek (10) Patent No.: US 8,479,140 B2
(45) Date of Patent: *Jul. 2, 2013

(54) AUTOMATICALLY CREATING VIAS IN A CIRCUIT DESIGN

(75) Inventor: Joseph Edward Pekarek, Manhattan Beach, CA (US)

(73) Assignee: AWR Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/334,812

(22) Filed: Dec. 22, 2011

(65) Prior Publication Data

US 2012/0131534 A1      May 24, 2012

Related U.S. Application Data

(63) Continuation of application No. 12/220,508, filed on Jul. 25, 2008, now Pat. No. 8,086,991.

(60) Provisional application No. 60/961,936, filed on Jul. 25, 2007.

(51) Int. Cl.
    *G06F 17/50*      (2006.01)

(52) U.S. Cl.
    USPC ............ 716/126; 716/110; 716/130; 716/137

(58) Field of Classification Search
    USPC ................. 716/118–119, 122–132, 134–135, 716/110, 137–138
    See application file for complete search history.

(56) References Cited

U.S. PATENT DOCUMENTS

| | | |
|---|---|---|
| 4,630,219 A | 12/1986 | DiGiacomo et al. |
| 4,829,446 A | 5/1989 | Draney |
| 6,584,608 B1 | 6/2003 | Kumada et al. |
| 7,302,661 B2 | 11/2007 | Beattie et al. |
| 7,305,648 B2 | 12/2007 | Petunin et al. |
| 7,409,666 B2 | 8/2008 | Almeida et al. |
| 7,454,734 B2 | 11/2008 | Uchida |
| 7,543,262 B2 | 6/2009 | Wang et al. |
| 2002/0035720 A1 | 3/2002 | Kitamura et al. |
| 2002/0083407 A1 | 6/2002 | Suzuki et al. |
| 2002/0162079 A1 | 10/2002 | Igarashi et al. |
| 2003/0014725 A1 | 1/2003 | Sato et al. |
| 2003/0115568 A1 | 6/2003 | Miller et al. |
| 2003/0188284 A1* | 10/2003 | Rubin et al. .................... 716/11 |
| 2004/0210862 A1 | 10/2004 | Igarashi et al. |

(Continued)

*Primary Examiner* — Stacy Whitmore (74) *Attorney, Agent, or Firm* — Meyertons Hood Kivlin Kowert & Goetzel, P.C.; Jeffrey C. Hood; Mark S. Williams (57) ABSTRACT

Creating and detecting crossings of conductive traces on different layers of an integrated circuit or a conducting trace over a device contact in a system. Values are stored by a system simulator corresponding to a galvanic potential or same "net". According to a set of rule based instructions vias are automatically displayed, correct-by-construction, and via connections between the traces, or the trace and device contact, to short circuit the paths. The via structure will not be created if it will short-circuit a conducting trace not associated with the net in question. By connecting traces on different layers using automatically created via structures so as not to short circuit other net traces, errors are eliminated and design cycles reduced when compared to a manual design scheme of inserting via connections. There is an interactive mode which allows the via to be easily resized by the use of familiar control handles.

29 Claims, 13 Drawing Sheets

U.S. PATENT DOCUMENTS

| | | |
|---|---|---|
| 2004/0225986 A1 | 11/2004 | Lin et al. |
| 2004/0255258 A1* | 12/2004 | Li .................................... 716/8 |
| 2004/0268283 A1 | 12/2004 | Perry et al. |
| 2005/0086623 A1 | 4/2005 | Becker et al. |
| 2005/0086626 A1 | 4/2005 | Sato et al. |
| 2005/0114821 A1* | 5/2005 | Petunin et al. ................. 716/15 |
| 2005/0251770 A1 | 11/2005 | Frank et al. |
| 2006/0117290 A1* | 6/2006 | Katagiri .......................... 716/13 |
| 2006/0136856 A1 | 6/2006 | Tang et al. |
| 2006/0195809 A1 | 8/2006 | Cohn et al. |
| 2007/0130553 A1 | 6/2007 | Wang et al. |
| 2007/0300195 A1* | 12/2007 | Li .................................... 716/5 |
| 2008/0034342 A1* | 2/2008 | Petunin et al. ................. 716/15 |
| 2008/0111158 A1* | 5/2008 | Sherlekar et al. ............. 257/207 |
| 2008/0216040 A1* | 9/2008 | Furnish et al. ................. 716/10 |
| 2009/0024977 A1 | 1/2009 | Hetzel et al. |
| 2010/0042957 A1 | 2/2010 | Ueda |
| 2010/0162194 A1* | 6/2010 | Qian ............................... 716/11 |
| 2010/0180247 A1* | 7/2010 | Scheffer et al. ................. 716/8 |

* cited by examiner

AUTOMATICALLY CREATING VIAS IN A CIRCUIT DESIGN

PRIORITY CLAIM

This application is a continuation of U.S. application Ser. No. 12/220,508, titled "Automatic Creation of Vias in Electrical Circuit Design", filed Jul. 25, 2008 now U.S. Pat. No. 8,086,991, which claims benefit of priority from U.S. Provisional Application No. 60/961,936, filed on Jul. 25, 2007, both of which are hereby incorporated by reference in their entirety as though fully and completely set forth herein.

BACKGROUND OF THE INVENTION

1. Field of the Invention

This invention provides an automatic via creation tool for use with electronic design automation ("EDA") systems used in integrated circuit design. Specifically, this invention relates to the automatic creation of via connections between overlapping conducting traces when those conducting traces are part of the same net.

2. Related Art

As the complexity, efficiency and robustness requirements in electrical devices like mobile phones, satellite receivers and wireless local area networks increase, more efficient and accurate circuit design of such devices are needed. To reduce product development schedules and make the design work as efficient as possible, it is important to automate this work, too. This design work is often performed by means of computer and associated software in which case the design is stored into the memory of a computer as a virtual representation.

Circuit design typically involves several steps. Usually the design starts with some schematic representation of the circuit that can then be simulated to observe and manipulate the behavior of the design. When the design on a schematic level is found working, a layout of the circuit is produced. The layout is usually a collection of metallizations, routes or traces of other conducting material interconnecting the various electrical components of the circuit design. These conducting traces are fabricated e.g. over and into a printed circuit board, into an integrated circuit or a ceramic slab or other such technology, possibly in several layers.

In designing modern electronic circuits, there are increasing numbers metallization layers that are used to interconnect the various components of the circuit. In RF and high frequency circuits in particular, the interconnect routing and connecting of these components is performed interactively using graphical layout editors. When connecting between two conducting layers or between a conducting layer and the pin of a device, a via or contact structures must be inserted to make an electrical connection between the two. Finding the locations of these connection areas by visual inspection can be very time consuming and error prone for the circuit designer, especially if the circuit contains many components and connections. Once found, creating the via or contact structures to make a connection is also very tedious and error prone. To a circuit designer, it is advantageous to automate the creation of the via structure procedure as much as possible.

Prior art methods of via connection between conducting traces on different layers of an integrated circuit are available commercially in other electronic design automation software, but their design is very limited. In other popular commercial custom electronic layout editors such as Cadence's VirtuosoXL, vias can be inserted between conducting layers, but require a continuous path description and/or an explicit request in order to insert a via into the design. In automatic place and route software such as Magma and Synopsys P&R products, vias are automatically inserted between layers on a continuous routed path. This invention does not require the user to identify the need for or a requirement that the user request insertion a via connection between conducting paths that happen to overlap during the interactive custom layout process. This invention teaches the automatic creation of the via.

SUMMARY

This invention is directed to a methodology of detecting crossings of conductive traces on different layers of an integrated circuit or a conducting trace over a device contact stored into the memory of a computer, corresponding to the same galvanic potential or same "net" and then automatically placing, correct-by-construction, a via connection between the traces, or the trace and device contact, to short circuit them. The via structure will not be created if it will create a short-circuit to a conducting trace not associated with the net in question. By connecting traces on different layers using automatically created via structures so as not to short circuit other net traces, errors are eliminated and design cycles times are reduced when compared to creating manual via connections.

This invention also teaches the automatic placement of the via structure without the need to specify which metal layout needs connecting on another metal layer in the integrated circuit design. This invention routes a path according to a net of predefined circuit components. If that route path crosses another path on another layer in the circuit layout that is part of the same net, a via is automatically created based on the via creation rules set by the user. Thus, the system will automatically recognize when two metal layers cross that are part of the same net, vias are created according to the design rules specified by the user.

There are a number of useful features that can be applied to the automatic via structure creation. For example, an interactive mode allowing easily resizing of the via structure by the use of familiar control handles in the graphical user interface display. The invention allows for the creating of certain rules such as preventing automatic via creation when the trace does not come into overlap contact with a pin structure on a layer above or below the trace. Certain user defined rules may allow for the enforcement of vias created according to a minimum size, the size covers the pin-route intersection, or the entire pin area.

Other features include creating via and keeping the structure size inside the size dimensions of the trace including forcing a rectangular via structure to orient in the horizontal or vertical position. Optionally, the user can periodically override selected features of the automatic via creation rules.

Other systems, methods, features, and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION OF THE DRAWINGS

The components in the figures are not necessarily to scale, emphasis being placed instead upon illustrating the principles of the invention. In the figures, like reference numerals designate corresponding parts throughout the different views.

DETAILED DESCRIPTION

This invention assumes that the system simulator knows each polygon or circuit component in the net without running any other tools such as a layout versus schematic ("LVS") tool or any explicit definition of where a via needs to be place in the layout as a single path definition by place and route tools. In traditional layout editors, the user has to inquire as to whether or not to insert a via between two different pieces of metals located on different layers of the integrated circuit layout. The layout is usually a collection of layers of metallizations separated by other layers while having routes or traces of conducting material interconnecting the various electrical components of the design. Typically, the creation of vias can be made in integrated circuit designs but it can also be created in the design of printed circuit boards.

The circuit design implicitly contains the knowledge of the nets allocated to the circuit components. The integrated data model understands the connectivity in the model. As soon as the two metal layers overlap, the system creates a via structure according to the user defined rules. This automatic creation of vias eliminates the omission of the via structure by the user, placement in the wrong place within the layout or the creation of an improperly sized via structure violating system requirements. This automatic via creation make the via creation correct by construction connectivity. The system knows that the metal layers overlap from the schematic design. Nets are used to connect components in the schematic design. Thus, when the layout is created the system understands the location of the pins and the required connectivity from the creation of the nets. In this system, it is inherent that such connectivity exists. In prior art systems, it is possible for the connectivity and schematic to be inconsistent. In this system, the connectivity and schematic will always be consistent.

Via inter-connect is prohibited if a via is inserted when a second net interferes with the creation of a via that is large enough to interfere with the second net trace or component. Stray voltage can create a short circuit that is undesirable. An error checking feature may alert the user that a short circuit may exist and guide the user to the location in the layout where the problem exists.

In the physical layout of an integrated circuit, layers of insulators and metals are deposited forming the complex structure of the integrated circuit. This three dimensional layered structure is best represented by a layout diagram where the components are on located on a first level. Metal traces can also be located on the first layer as well as on the third layer. Insulating material is often deposited on the second layer and via structures created connecting the metal traces of the first and third layers so that electrical connectivity exists through the second insulating layer. Integrated circuit design is well known in the art and a plurality of layers may exist forming the overall circuit design.

Figure 1:
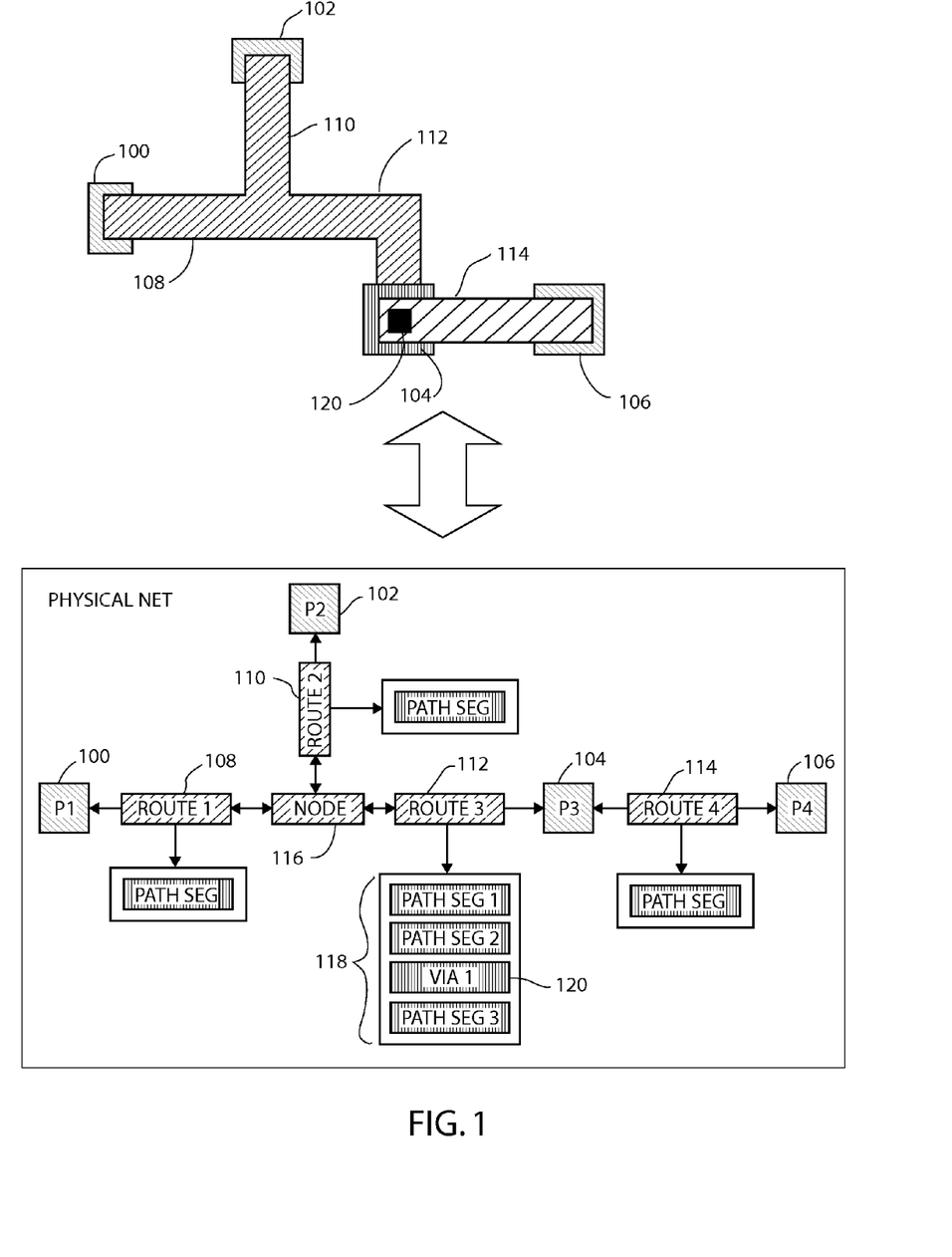
FIG. 1 is a top view of a simplified layout circuit diagram showing the interrelationship with a circuit schematic diagram with components connected by trace lines and via structures.

FIG. 1 is a top view of a simplified layout circuit diagram showing the interrelationship with a circuit schematic diagram with components connected by trace lines and via structures. In the circuit schematic, components have pins 100, 102, 104 and 106 and comprise a simplified circuit. Components 100, 102, 104 and 106 are interconnected along routes 1 (108), route 2 (110), route 3 (112) and route 4 (114). A node 116 marks the interconnection of the three routes 108, 110 and 112. For route 112, design rules define the route as a series of parameters 118 regarding the paths of the traces.

In the layout diagram of FIG. 1 corresponding to the schematic diagram, components 100 and 102 are located on the first level of the integrated circuit and components 104 and 106 are located on a second level. The trace lines of route 1 (108), rout 2 (110) and route 3 (112) are located on the same level. Route 4 (114) is located on an upper level. In a semiconductor, these two paths are located on different layers. Where their traces overlap, an opportunity is established for the creation of a via structure connecting the components 100, 102 and 104 together assuming they are all on the same net. Once the trace of route 3 (112) overlaps with pin 104, a via structure can be automatically created. Once the via is created, the circuit is complete.

Figure 2:
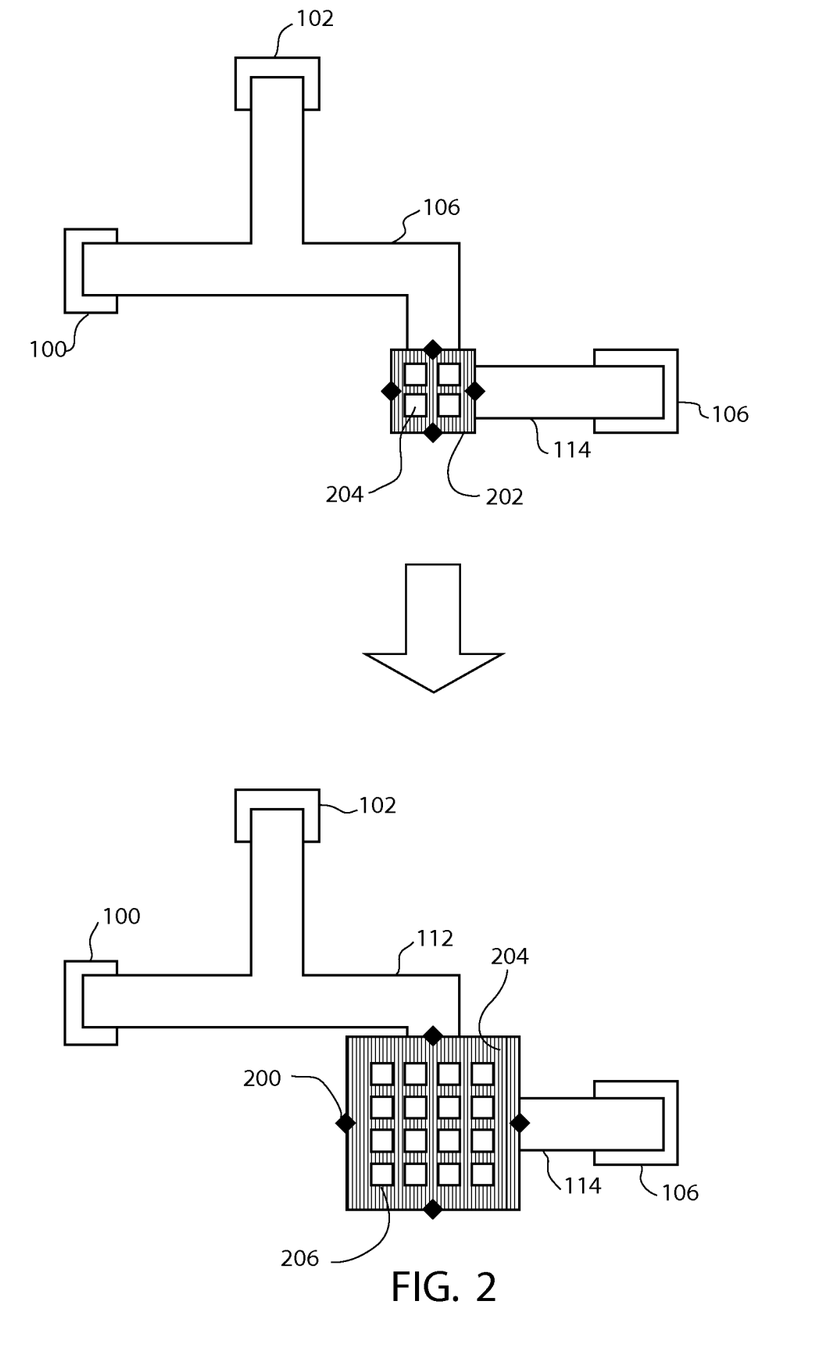
FIG. 2 is a top view of a simplified layout circuit diagram showing the resizing of the via structure by expansion handles.

FIG. 2 is a top view of a simplified layout circuit diagram showing the resizing of the via structure by expansion handles 200. Once the via structure is created 202 in the layout design, control handles 200 can allow a user to resize the via structure increasing the size of the via 202 or creating a via cap 204 and forming a plurality of via structures 206.

Figure 3:
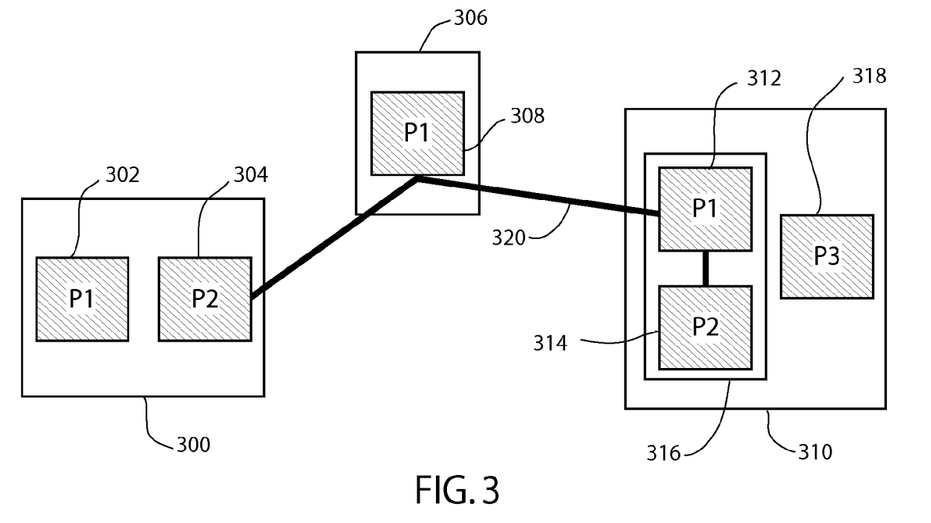
FIG. 3 is a top view of a simplified layout circuit diagram showing different circuit elements of a physical net connected by trace lines and via structures.

FIG. 3 is a top view of a simplified layout circuit diagram showing different circuit elements of a physical net connected by trace lines and via structures. Electronic component 300 comprises pins P1 (302) and P2 (304). Electronic component 306 comprises pin P1 (308). Electronic component 310 comprises pins P1 (312) and P2 (314) forming structure 316, and pin P3 (318). Connecting P2 (304), P1 (308) and structure 316 having pins P1 (312) and P2 (314) forms a net 320. Once the net 320 is created, connecting metal traces between electronic components 300, 306 and 310 allows the system to automatically permit for the accurate and correct creation of via structures.

Figure 4:
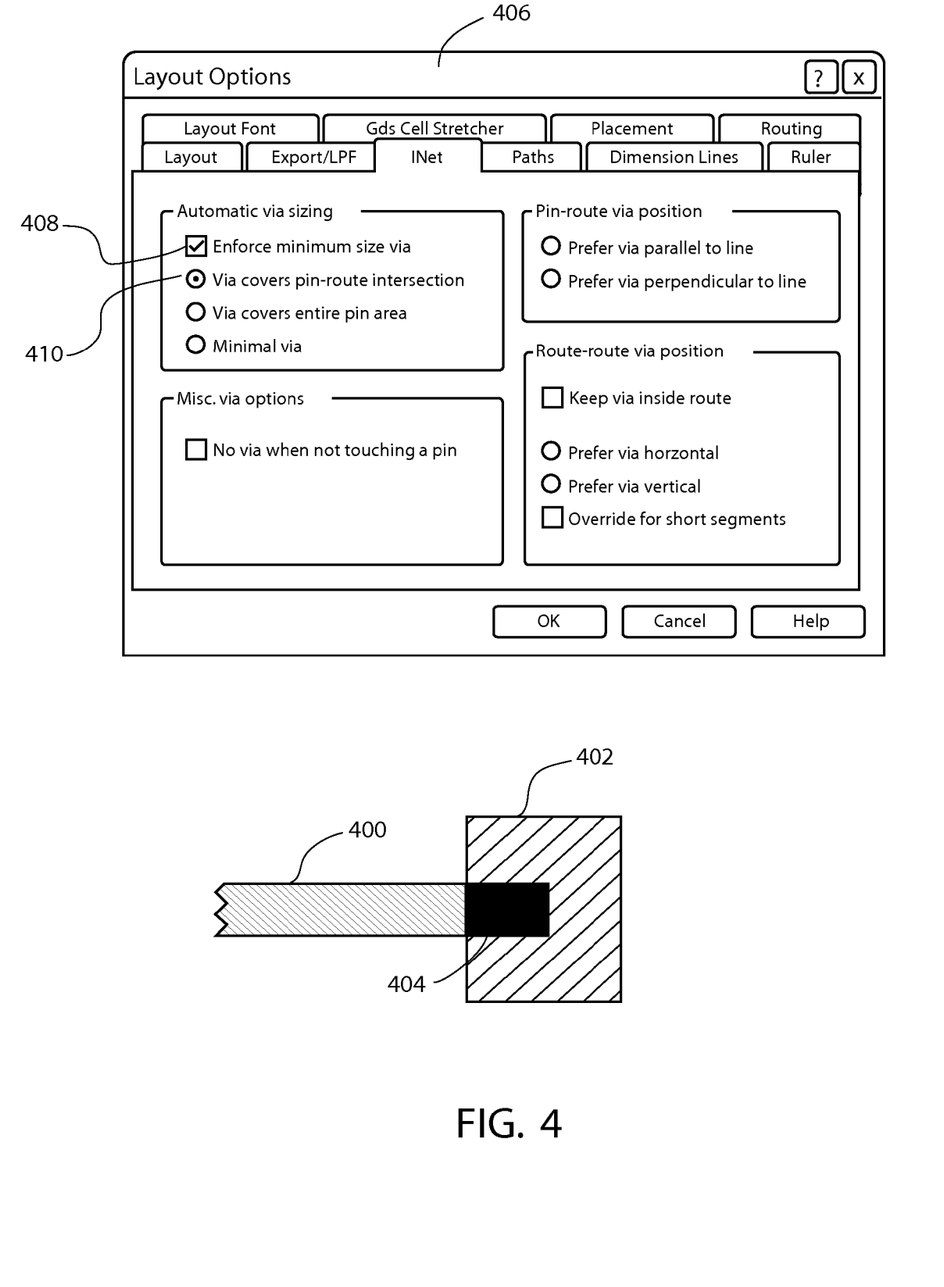
FIG. 4 is a top view of a trace line and pin structure corresponding to a graphical user interface of a system layout option menu structure.

FIG. 4 is a top view of a trace line and pin structure corresponding to a graphical user interface of a system layout option menu structure. The metal trace route 400 is represented in the bottom of the figure. When the metal trace route is drawn in a system such that the trace route 400 overlaps a pin 402 located on another layer of the semiconductor, a via structure 404 is automatically created.

Associated with the automatic via creation tool is a menu layout 406 for selecting various rules for forming the automatic via structures. In the menu layout 406, the size of the via structure is controlled by a user selecting to enforce the minimum size rule 408. This rule ensures that the size of the via structure is no larger than the minimum required. Should the user not select to enforce minimum size via, the via structure created will fill to the size limits of the other user selected rules. Another rule controlled by the user is whether the via will cover the pin route intersection 410. This sizing rule is illustrated in the layout located below the menu layout 406 where the via 404 covers the entire area of the metal trace 400 overlap with the pin 402.

Figure 5:
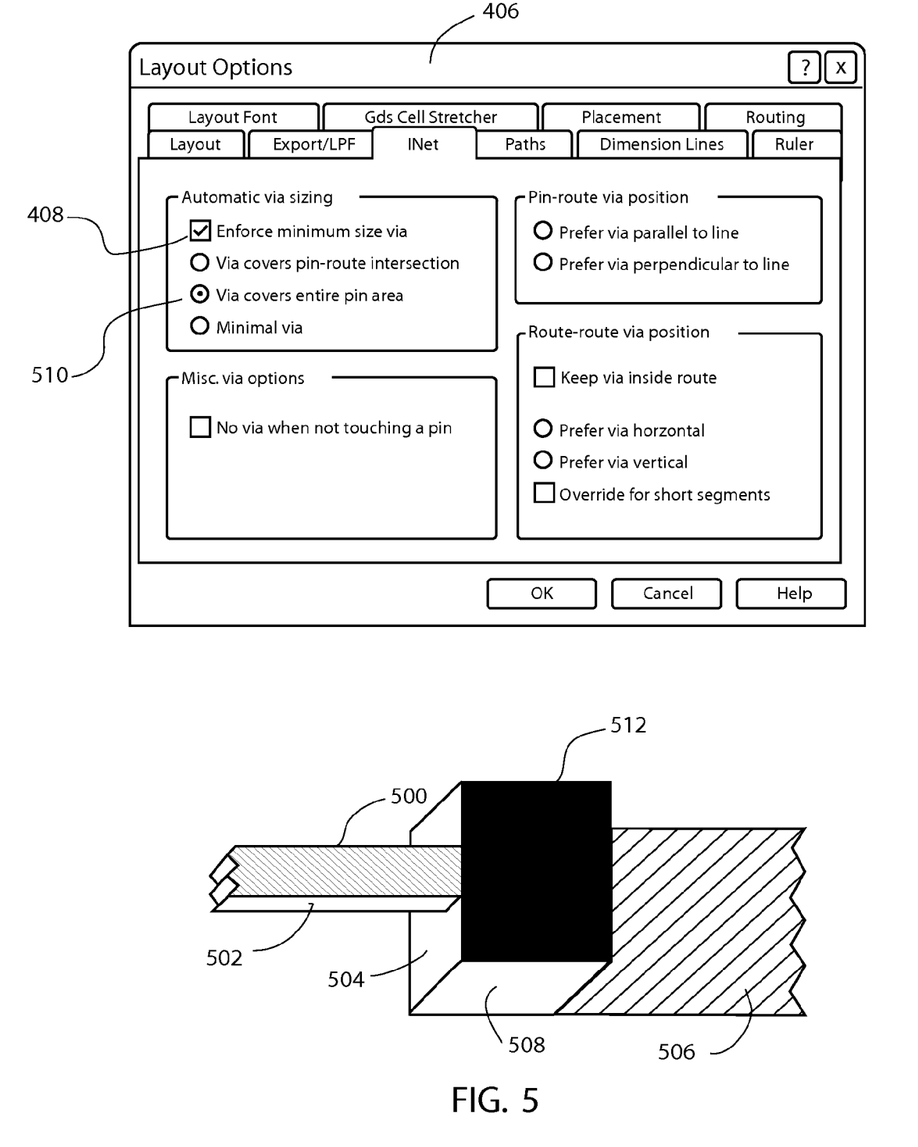
FIG. 5 is a top view of a trace line and pin structure corresponding to a graphical user interface of a system layout option menu structure.

FIG. 5 is a top view of a trace line and pin structure corresponding to a graphical user interface of a system layout option menu structure. The metal trace route 500 is represented in the bottom of the figure. When the metal trace route is drawn in a system such that the trace route 500 located on a second layer 502 overlaps a pin 504 located on a first layer 506 of the semiconductor, a via structure 508 is automatically created.

Associated with the automatic via creation tool is a menu layout 406 for selecting various rules for forming the automatic via structures. In the menu layout 406, the size of the via structure is controlled by a user selecting to enforce the minimum size rule 408. This rule ensures that the size of the via structure is no larger than the minimum required. Should the user not select the rule enforce minimum size via, the via structure created will fill to the size limits of the other user selected rules. Another rule controlled by the user is whether the via will cover the entire pin area 510. This sizing rule is illustrated in the layout located below the menu layout 406 where the via 508 covers the entire area of the pin overlap 512.

Figure 6:
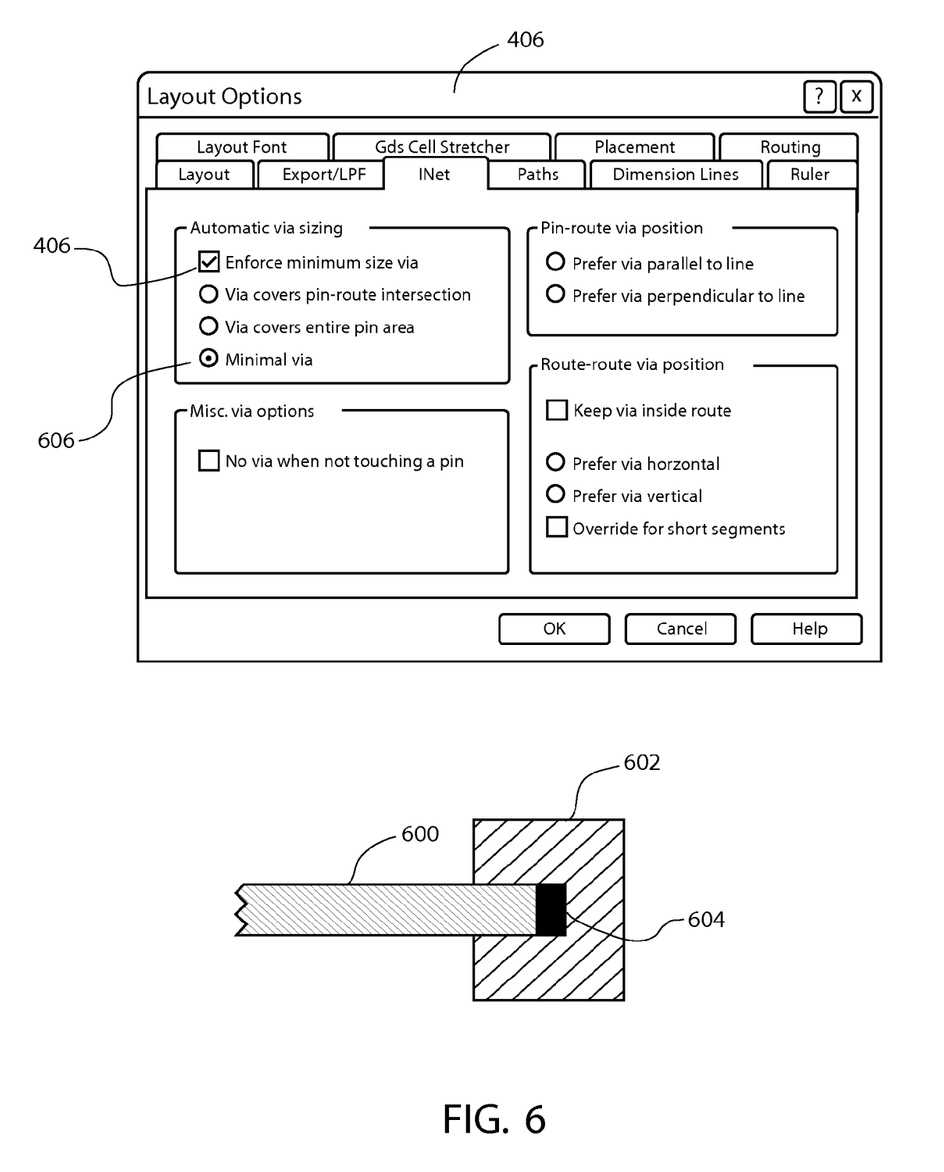
FIG. 6 is a top view of a trace line and pin structure corresponding to a graphical user interface of a system layout option menu structure.

FIG. 6 is a top view of a trace line and pin structure corresponding to a graphical user interface of a system layout option menu structure. The metal trace route 600 is represented in the bottom of the figure. When the metal trace route is drawn in a system such that the trace route 600 located on a second layer overlaps a pin 602 located on a first layer of the semiconductor, a via structure 604 is automatically created.

Associated with the automatic via creation tool is a menu layout 406 for selecting various rules for forming the automatic via structures. In the menu layout 406, the size of the via structure is controlled by a user selecting to enforce the minimum size rule 408. This rule ensures that the size of the via structure is no larger than the minimum required. Should the user not select the rule enforce minimum size via, the via structure created will fill to the size limits of the other user selected rules. Another rule controlled by the user is whether the via will cover the minimum via area 606. This sizing rule is illustrated in the layout located below the menu layout 406 where the via 604 covers the minimum area of the pin overlap 604.

Figure 7:
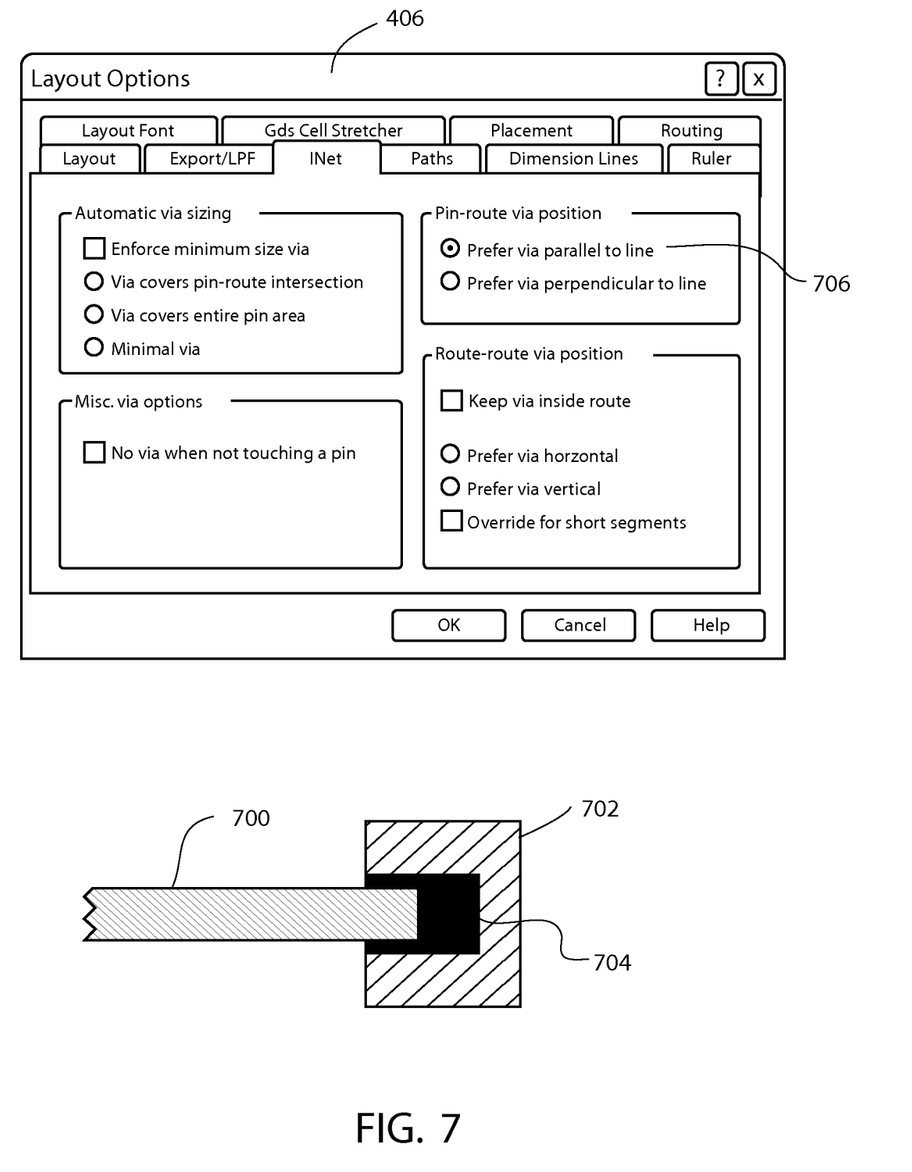
FIG. 7 is a top view of a trace line and pin structure corresponding to a graphical user interface of a system layout option menu structure.

FIG. 7 is a top view of a trace line and pin structure corresponding to a graphical user interface of a system layout option menu structure. The metal trace route 700 is represented in the bottom of the figure. When the metal trace route 700 is drawn in a system such that the trace route 700 located on a second layer overlaps a pin 702 located on a first layer of the semiconductor, a via structure 704 is automatically created.

Associated with the automatic via creation tool is a menu layout 406 for selecting various rules for forming the automatic via structures. In the menu layout 406, the size of the via structure is controlled by a user who can select the pin route position such as preference to the creation of the via parallel to the line 706 of the route trace 700. This rule ensures that the orientation of the via structure is located in the same parallel orientation as the trace route.

Figure 8:
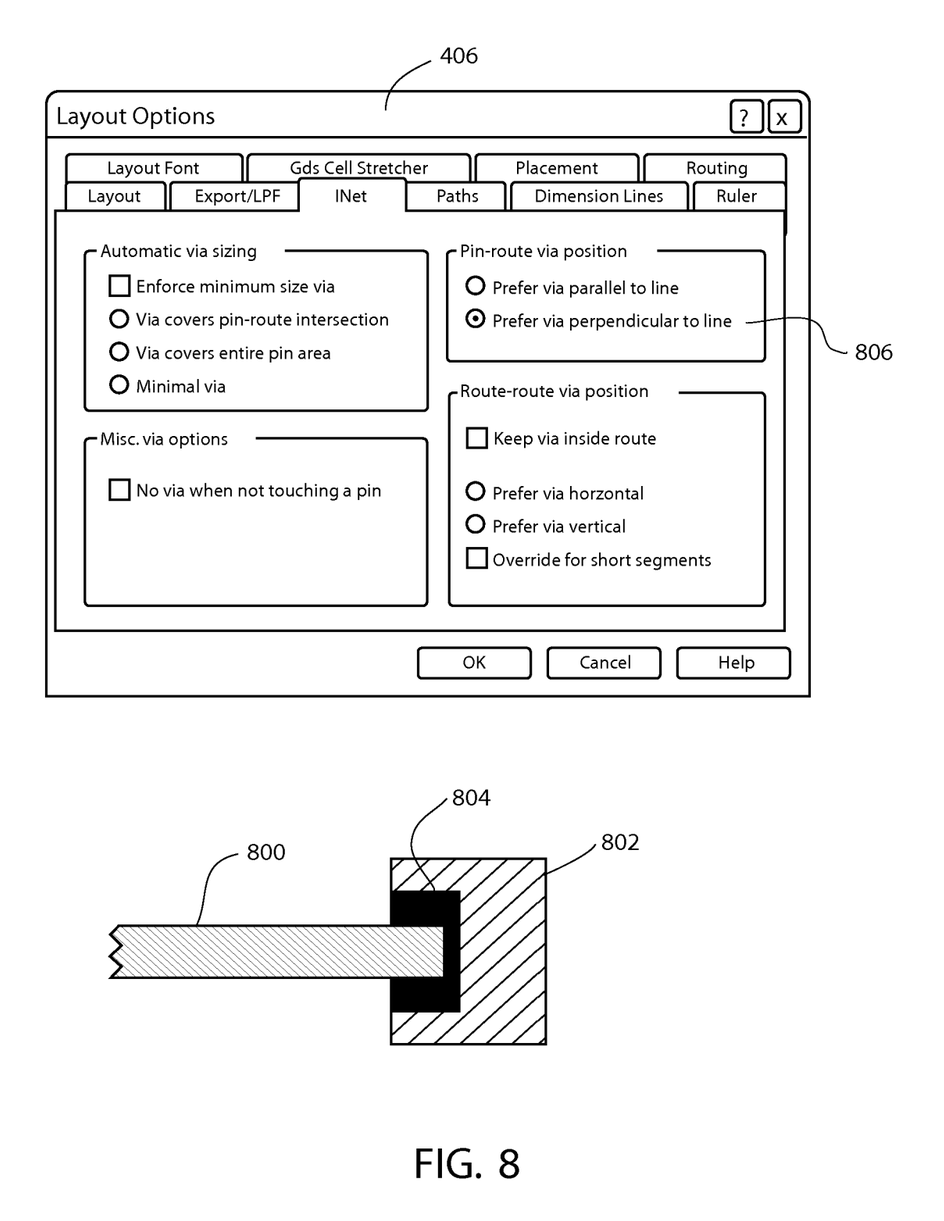
FIG. 8 is a top view of a trace line and pin structure corresponding to a graphical user interface of a system layout option menu structure.

FIG. 8 is a top view of a trace line and pin structure corresponding to a graphical user interface of a system layout option menu structure. The metal trace route 800 is represented in the bottom of the figure. When the metal trace route 800 is drawn in a system such that the trace route 800 located on a second layer overlaps a pin 802 located on a first layer of the semiconductor, a via structure 804 is automatically created.

Associated with the automatic via creation tool is a menu layout 406 for selecting various rules for forming the automatic via structures. In the menu layout 406, the size of the via structure is controlled by a user who can select the pin route position such as preference to the creation of the via perpendicular to the line 804 of the route trace 800. This rule ensures that the orientation of the via structure is located in the perpendicular orientation as the trace route.

Figure 9:
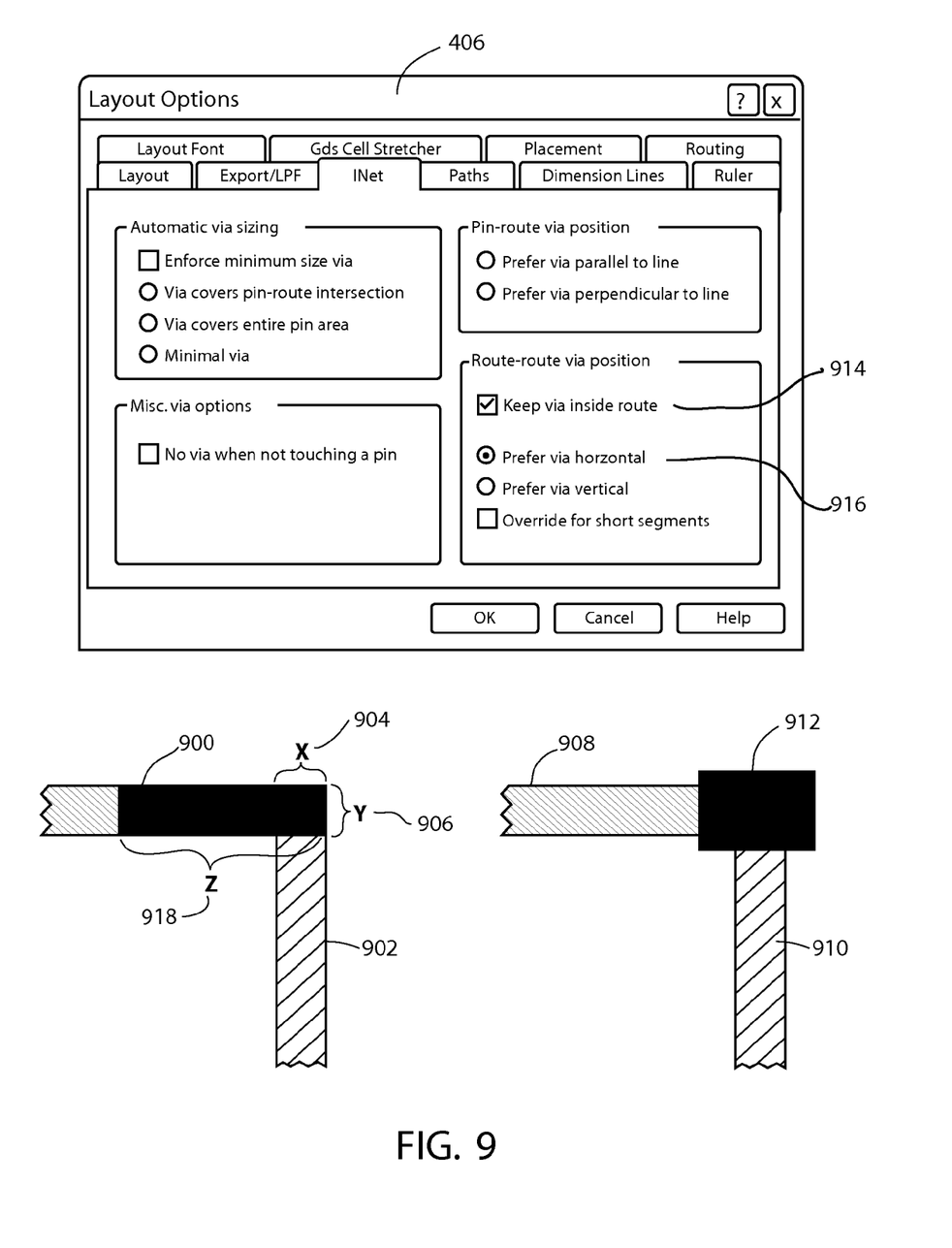
FIG. 9 is a top view of a trace line and pin structure corresponding to a graphical user interface of a system layout option menu structure.

FIG. 9 is a top view of a trace line and pin structure corresponding to a graphical user interface of a system layout option menu structure. Here, trace route 900 is located on a second layer of an integrated circuit while trace route 902 is located on a first layer. Assuming that the two trace routes are on the same net, when trace route 900 is drawn such that there exists over lap of the area defined by x 904 and y 906, a via is automatically created. Because of the sizing requirements of the via, the via created may need to be larger than the area of overlap defined by x 904 and y 906. In the example where route trace 908 overlaps with route trace 910, the overlap may need to create a via having dimensions that are greater than the area of the overlap. This larger cross sectional area of the via is represented by the area 912.

Associated with the automatic via creation tool is a menu layout 406 for selecting various rules for forming the automatic via structures. In the menu layout 406, the orientation and sizing of the via structure is controlled by the user. The user has the option of keeping the via inside the route trace 914. Also, the user can select a preference rule of orienting the via horizontally inside the route trace 916. Thus, the via can be automatically be resized to the area defined by z 918 and y 906.

Figure 10:
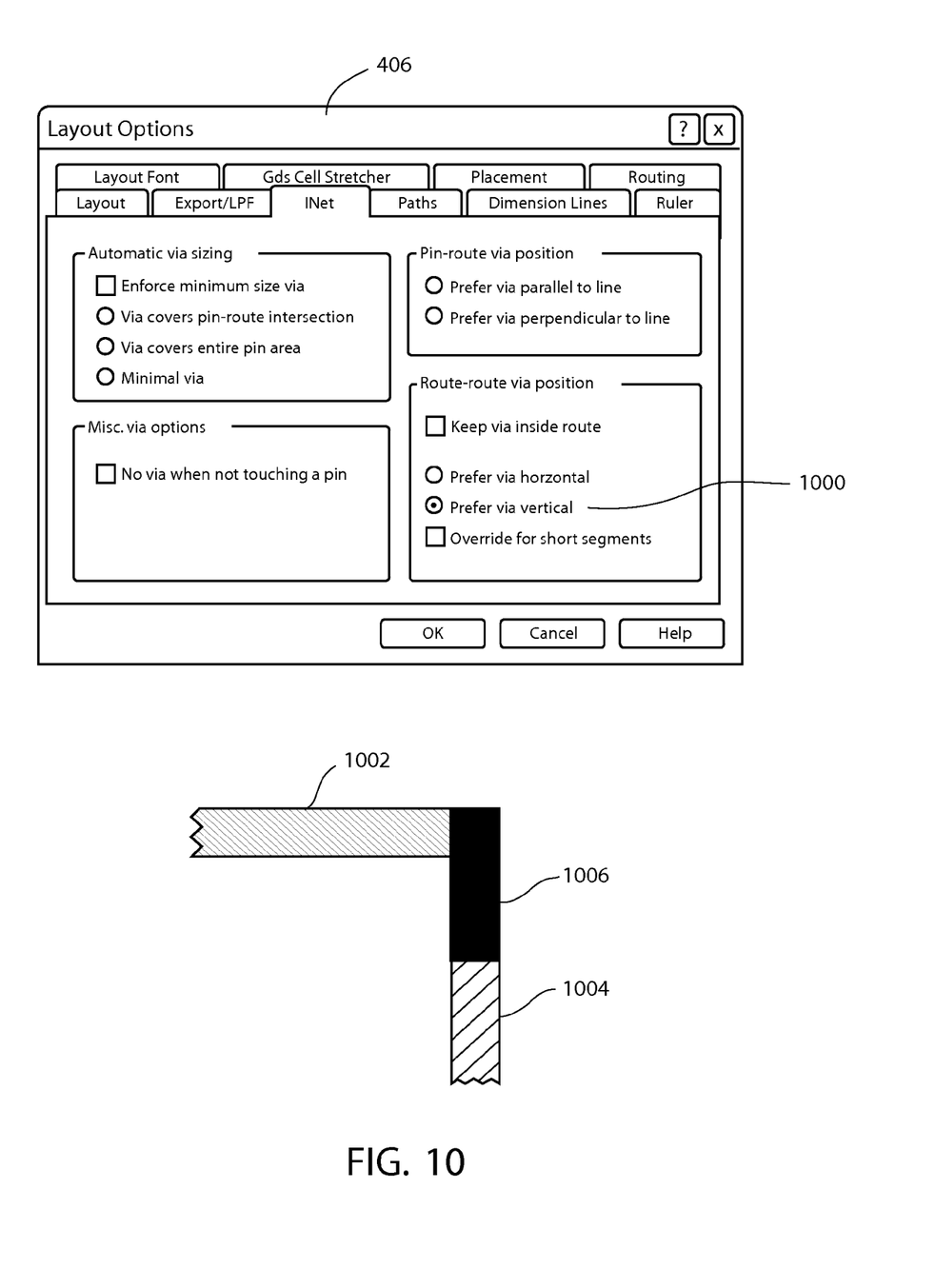
FIG. 10 is a top view of a trace line and pin structure corresponding to a graphical user interface of a system layout option menu structure.

FIG. 10 is a top view of a trace line and pin structure corresponding to a graphical user interface of a system layout option menu structure. As an alternative to the menu layout 406 option for orienting the via in the horizontal dimension inside the route trace 1004, the user can select to orient the via in the vertical direction 1000. Thus, when the route trace 1002 on the second layer of the integrate circuit overlaps the route trace 1004 located on a first layer, but within the same net, the via may be automatically created 1006 in the vertical direction.

Figure 11:
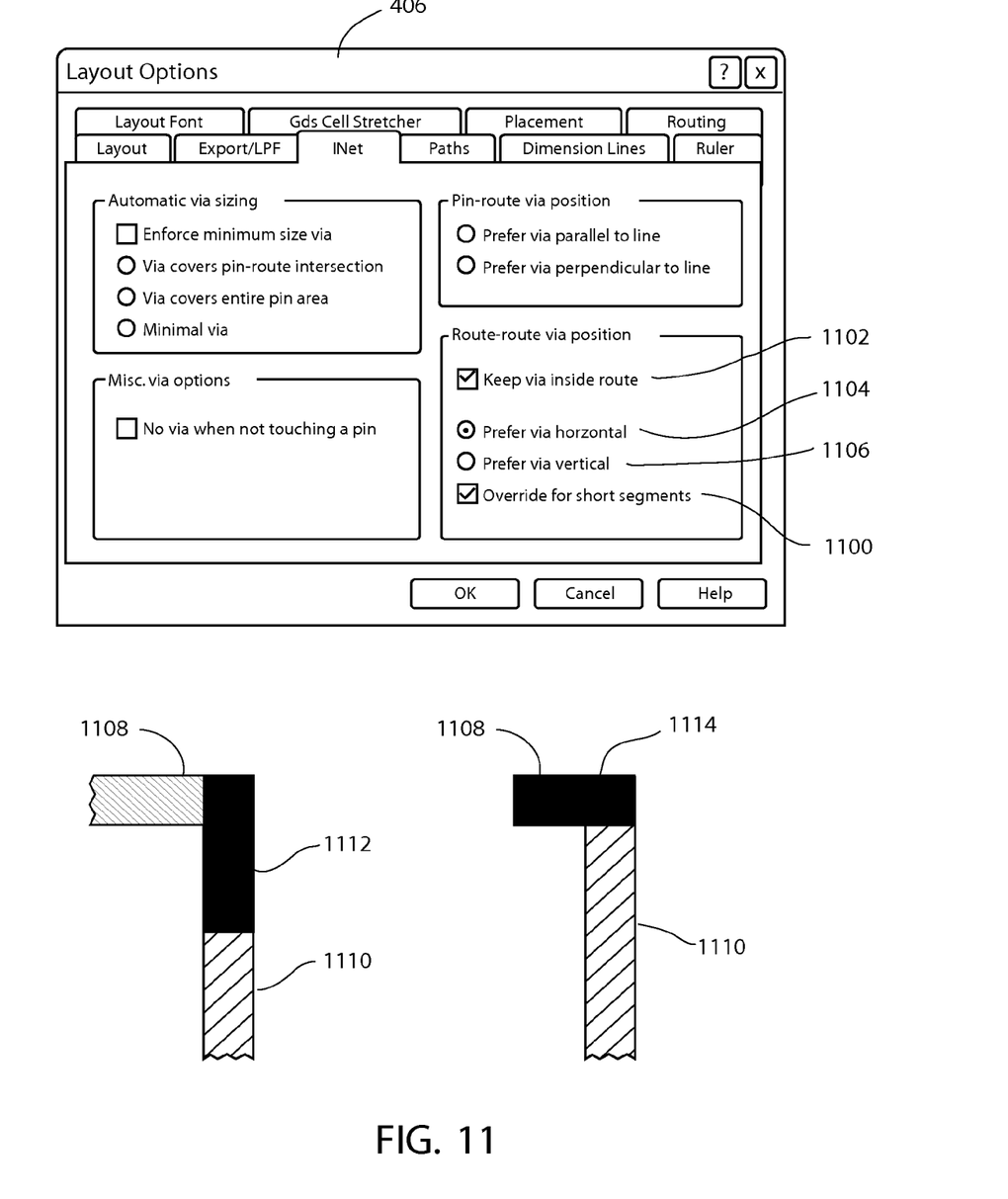
FIG. 11 is a top view of a trace line and pin structure corresponding to a graphical user interface of a system layout option menu structure.

FIG. 11 is a top view of a trace line and pin structure corresponding to a graphical user interface of a system layout option menu structure. In the layout 406, the user can select to override for short segments 1100 the option to keep the via inside the route trace 1102 and orient the via in the horizontal 1104 or vertical 1106 dimension. Thus, the where normally when the route trace 1108 located on a second layer of an integrated circuit overlaps the route trace 1110 on the same net, the via would normally be oriented in the vertical position 1112 assuming the user had selected the keep inside route option 1102 and prefer vertical orientation 1106. If the user selected the override option 1100, the via would be oriented in the horizontal orientation 1114.

Figure 12:
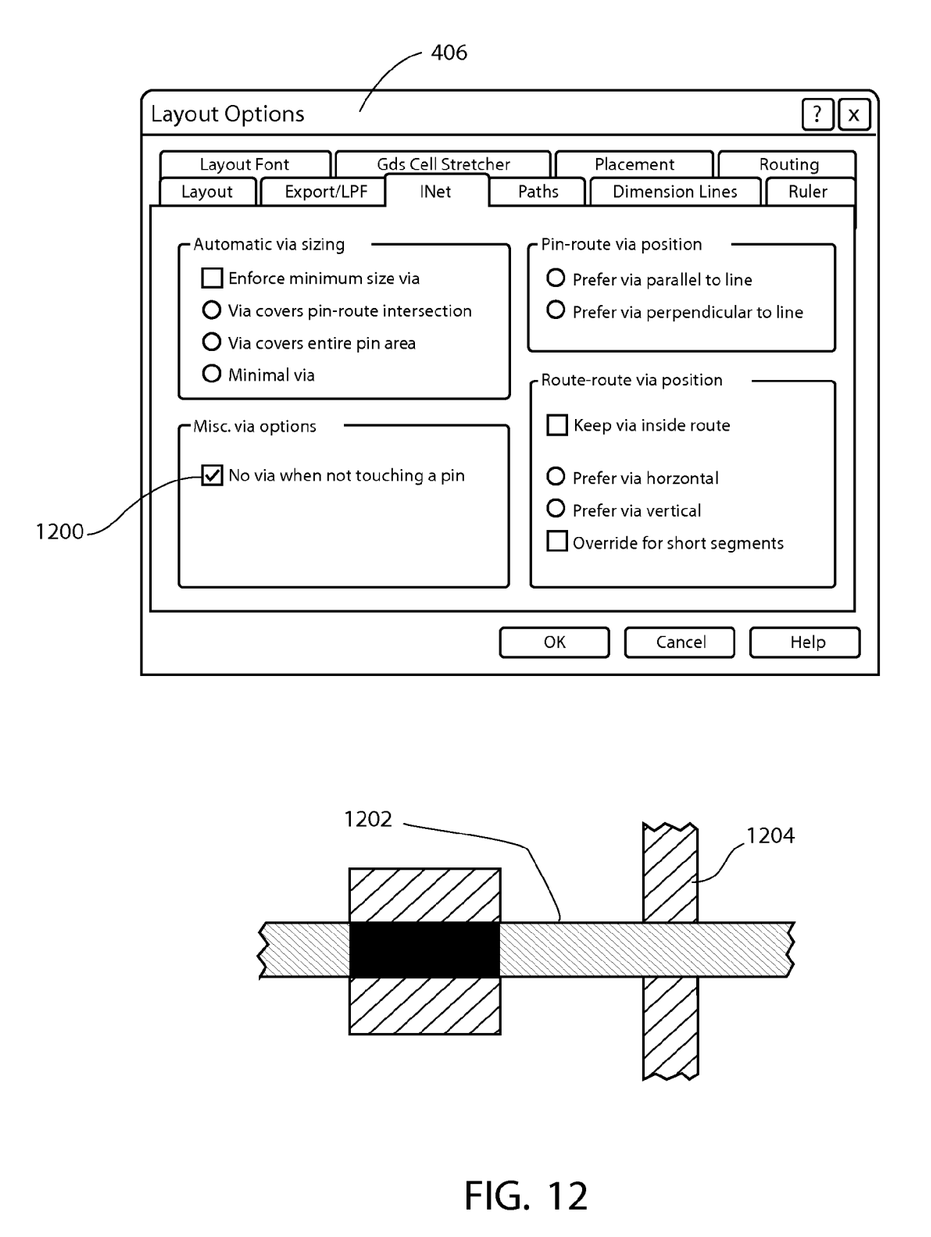
FIG. 12 is a top view of a trace line and pin structure corresponding to a graphical user interface of a system layout option menu structure.

FIG. 12 is a top view of a trace line and pin structure corresponding to a graphical user interface of a system layout option menu structure. Another option for a user in layout 406 is for a prohibition of the automatic via creation when the route trace is not overlapping a pin 1200. Normally, when route trace 1202 approaches and then overlaps route trace 1204, a via is automatically created. However, if the user selects the option prohibiting the automatic via creation unless the route trace overlaps a pin 1200, then no via is created.

Figure 13:
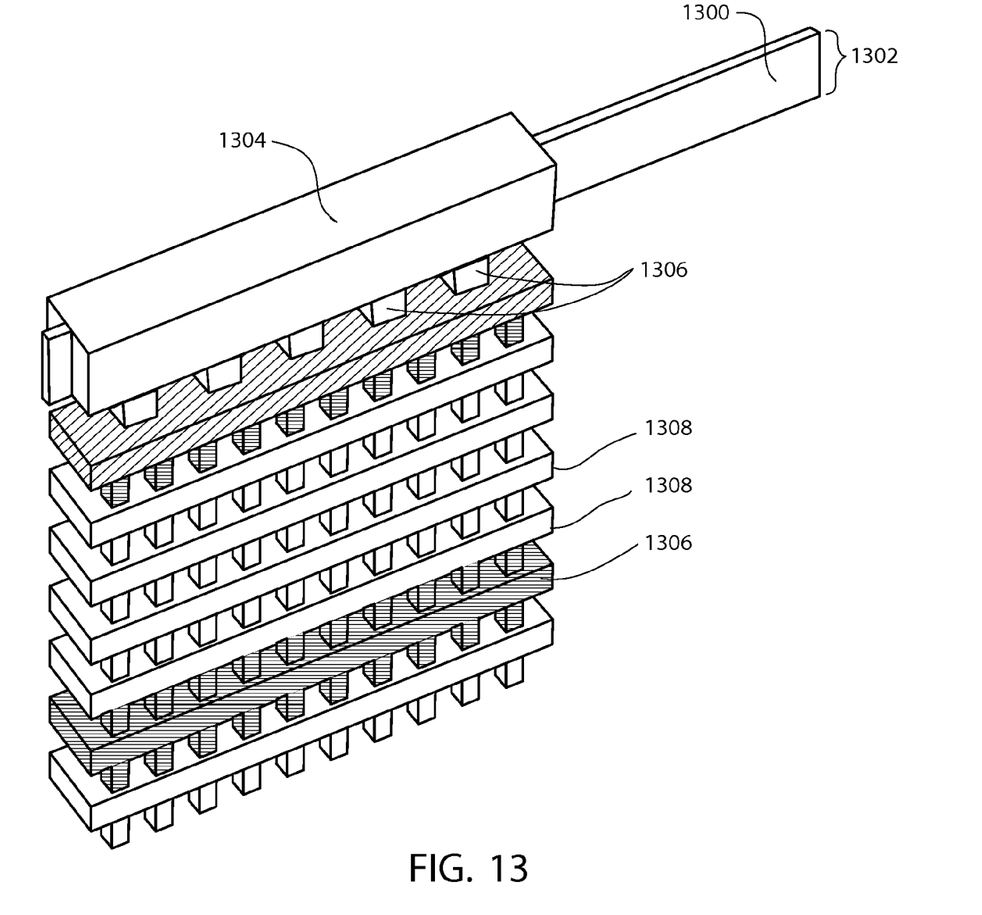
FIG. 13 is a perspective view of a via cap structure.

FIG. 13 is a perspective view of a via cap structure. When a route trace 1300 on a first layer 1302 overlaps a pin or a route trace connected to the same net but located on another layer. The via structure may need to be larger in width 1304 than the route trace 1300. As such, the via may also need to be formed with a plurality of columns 1306. In some instances depending upon the design rules, the via structure may require alternating layers of columns 1306 and layers 1308 according to the design criteria of the structure.

While various embodiments of the invention have been described, it will be apparent to those of ordinary skill in the art that many more embodiments and implementations are possible that are within the scope of this invention.

What is claimed is:

1. A non-transitory computer-readable memory medium that stores program instructions executable by a processor to:
   determine an overlap area between at least two circuit components in a layout representation of a circuit design, wherein the circuit design comprises information regarding allocation of nets to circuit components in a schematic representation of the circuit design, and wherein the at least two circuit components are part of a first net in the schematic representation of the circuit design; and
   automatically insert a conducting via in the overlap area between the at least two circuit components in the layout representation of the circuit design, based on the information regarding allocation of nets in the schematic representation of the circuit design, wherein the conducting via connects at least two layers in the layout representation of the circuit design without the at least two layers having previously been identified as needing to be connected to each other in the overlap area.

2. The non-transitory computer-readable memory medium of claim 1, wherein the circuit components comprise metallization layers.

3. The non-transitory computer-readable memory medium of claim 1, wherein the circuit components comprise device pins.

4. The non-transitory computer-readable memory medium of claim 1, wherein the program instructions are further executable to perform:
   resizing the conducting via size in response to user input to user control handles associated with the conducting via.

5. The non-transitory computer-readable memory medium of claim 1, wherein the overlap area comprises an overlap between the at least two layers.

6. The non-transitory computer-readable memory medium of claim 1, wherein the program instructions are further executable to perform:
   setting the conducting via size by limiting the conducting via to the overlap area of the circuit component with the conducting via.

7. The non-transitory computer-readable memory medium of claim 1, wherein the program instructions are further executable to perform:
   setting the conducting via size by extending the conducting via to extend beyond the overlap area of the circuit component with the conducting via.

8. The non-transitory computer-readable memory medium of claim 1, wherein the program instructions are further executable to perform:
   creating a via cap capable of supporting a plurality of conducting vias.

9. The non-transitory computer-readable memory medium of claim 1, wherein the program instructions are further executable to perform:
   setting the conducting via size by encompassing the area bounded by an overlap of the at least two circuit components with the conducting via.

10. The non-transitory computer-readable memory medium of claim 1, wherein the conducting via is automatically created between a first metal trace located on a first layer and a second metal trace located on a second layer.

11. The non-transitory computer-readable memory medium of claim 10, wherein the conducting via has a wider width than the first and second metal traces.

12. The non-transitory computer-readable memory medium of claim 1, wherein the program instructions are further executable to perform:
   creating user defined construction constraints to limit the resizing of the conducting via.

13. A computer-implemented method for automatically generating electrical connections between circuit components in a circuit design, the method comprising:
   utilizing a computer to perform:
      determining an overlap area between at least two circuit components in a layout representation of the circuit design, wherein the circuit design comprises information regarding allocation of nets to circuit components in a schematic representation of the circuit design, and wherein the at least two circuit components are part of a first net in the schematic representation of the circuit design; and
      automatically inserting a conducting via in the overlap area between the at least two circuit components in the layout representation of the circuit design, based on the information regarding allocation of nets in the schematic representation of the circuit design, wherein the conducting via connects at least two layers in the layout representation of the circuit design without the at least two layers having previously been identified as needing to be connected to each other in the overlap area.

14. A non-transitory computer-readable memory medium that stores program instructions executable by a processor to perform:
   determining an overlap area between at least two circuit components in the circuit design, wherein the circuit design comprises information regarding allocation of nets to circuit components in the circuit design, and wherein the at least two circuit components are part of a first net and have no other circuit components connected to a different net located in the overlap area between the at least two circuit components; and
   automatically inserting a conducting via structure in the circuit design based on user defined design rules and the information regarding allocation of nets to circuit components in the circuit design, wherein the conducting via structure comprises a plurality of vias and a via cap in the overlap area between the at least two circuit components, wherein the plurality of vias connect at least two layers in the circuit design.

15. The non-transitory computer-readable memory medium of claim 14, wherein the via cap is larger in cross sectional area than the plurality of vias.

16. The non-transitory computer-readable memory medium of claim 14, wherein the circuit components further comprise metallization layers.

17. The non-transitory computer-readable memory medium of claim 14, wherein the circuit components further comprise device pins.

18. The non-transitory computer-readable memory medium of claim 17, wherein the program instructions are further executable to perform:
setting the conducting via structure size by encompassing an area bounded by the overlapping area of a device pin with the conducting via structure.

19. The non-transitory computer-readable memory medium of claim 14, wherein the program instructions are further executable to perform:
creating a layout for a circuit board based on the circuit design, wherein the automatically inserted conducting via structure electrically connects at least two circuit layers.

20. The non-transitory computer-readable memory medium of claim 14, wherein the program instructions are further executable to perform:
creating a layout for an integrated circuit based on the circuit design, wherein the automatically inserted conducting via structure electrically connects at least two circuit layers.

21. The non-transitory computer-readable memory medium of claim 14, wherein the program instructions are further executable to perform:
resizing the conducting via structure size in response to user input to user control handles associated with the conducting via structure.

22. The non-transitory computer-readable memory medium of claim 14, wherein the program instructions are further executable to perform:
setting the conducting via structure size by limiting the conducting via structure to the overlap area of the at least two circuit components with the conducting via structure.

23. The non-transitory computer-readable memory medium of claim 14, wherein the program instructions are further executable to perform:
setting the conducting via structure size by extending the conducting via structure beyond the overlap area of the at least two circuit components with the conducting via structure.

24. The non-transitory computer-readable memory medium of claim 14, wherein the program instructions are further executable to perform:
creating the conducting via structure in the shape of a polygon.

25. The non-transitory computer-readable memory medium of claim 24, wherein the program instructions are further executable to perform:
resizing the conducting via structure in response to user input to one or more user control handles associated with the conducting via structure.

26. The non-transitory computer-readable memory medium of claim 25, wherein the program instructions are further executable to perform:
implementing construction constraints to limit the conducting via structure size.

27. A computer-implemented method for automatically generating electrical connections between circuit components in a circuit design, the method comprising:
utilizing a computer to perform:
determining an overlap area between at least two circuit components in the circuit design, wherein the circuit design comprises information regarding allocation of nets to circuit components in the circuit design, and wherein the at least two circuit components are part of a first net and have no other circuit components connected to a different net located in the overlap area between the at least two circuit components; and
automatically inserting a conducting via structure in the circuit design based on user defined design rules and the information regarding allocation of nets to circuit components in the circuit design, wherein the conducting via structure comprises a plurality of vias and a via cap in the overlap area between the at least two circuit components, wherein the plurality of vias connect at least two layers in the circuit design.

28. A non-transitory computer-readable memory medium that stores program instructions executable by a processor to perform:
determining that a plurality of metallic conducting traces comprised in two or more layers of a circuit design overlap, wherein the circuit design comprises information indicating that the plurality of metallic conducting traces are part of a first net;
determining whether there are no traces of other nets in the overlap of the plurality of metallic conducting traces;
determining whether a conducting via can automatically be created in the overlap between the plurality of metallic conducting traces in response to determining that there are no traces of other nets in the overlap of the plurality of metallic conducting traces; and
inserting at least one conducting via in the overlap between the plurality of metallic conducting traces in response to determining that the conducting via can be automatically created in the overlap, wherein said inserting is based on the information indicating that the plurality of metallic conducting traces are part of the first net.

29. The non-transitory computer-readable memory medium of claim 28, wherein the program instructions are further executable to perform:
resizing the at least one conducting via in response to user input to one or more control handles associated with the at least one conducting via.

* * * * *